(12) United States Patent
Jakobs

(10) Patent No.: US 7,888,948 B2
(45) Date of Patent: Feb. 15, 2011

(54) CONTROLLING AN ANALOG SIGNAL IN AN INTEGRATED CIRCUIT

(75) Inventor: Andreas Jakobs, Munich (DE)

(73) Assignee: Qimonda AG, Munich (DE)

( * ) Notice: Subject to any disclaimer, the term of this patent is extended or adjusted under 35 U.S.C. 154(b) by 427 days.

(21) Appl. No.: 12/026,143

(22) Filed: Feb. 5, 2008

(65) Prior Publication Data
US 2009/0195258 A1 Aug. 6, 2009

(51) Int. Cl.
*G01R 35/00* (2006.01)
(52) U.S. Cl. .................. 324/601; 324/602; 324/603
(58) Field of Classification Search .................. 324/601
See application file for complete search history.

(56) References Cited
U.S. PATENT DOCUMENTS
6,549,036 B1 4/2003 Lee

| 7,119,549 | B2 | 10/2006 | Lee et al. | |
|---|---|---|---|---|
| 7,161,513 | B2* | 1/2007 | Werner et al. | ................ 341/119 |
| 7,215,128 | B2 | 5/2007 | Fujisawa | |
| 2008/0315865 | A1* | 12/2008 | Doogue et al. | ............. 324/173 |

OTHER PUBLICATIONS

Maxim Integrated Products webpage entitled "Application Note 1080: Understanding SAR ADCs"; 6 pgs.; © 2008.
Wikepedia online encyclopedia webpage entitled "Binary Search Algorithm"; 7 pgs.; page last modified Feb. 6, 2008.

* cited by examiner

Primary Examiner—Thomas Valone
(74) Attorney, Agent, or Firm—Dicke, Billig & Czaja, PLLC

(57) ABSTRACT

A method of controlling an analog signal in an integrated circuit includes generating a first control signal having a first predetermined duration within the integrated circuit. The first control signal is configured to cause the analog signal to have a first signal level. The first signal level is compared to a level of a target signal. A second control signal is generated within the integrated circuit based on a result of the comparison. The second control signal is configured to cause the analog signal to have a second signal level. The second control signal has a second predetermined duration that is different than the first predetermined duration.

17 Claims, 5 Drawing Sheets

CONTROLLING AN ANALOG SIGNAL IN AN INTEGRATED CIRCUIT

BACKGROUND

In electronic systems, information is typically transferred via signals over electric wires. For high frequency operation, the electric impedance of the driver and the receiver should be matched to the electric impedance of the transmission line itself. If the impedances are not matched, a transmitted electromagnetic wave could be reflected at the receiver and possibly again at the driver.

SUMMARY

One embodiment provides a method of controlling an analog signal in an integrated circuit. The method includes generating a first control signal having a first predetermined duration within the integrated circuit. The first control signal is configured to cause the analog signal to have a first signal level. The first signal level is compared to a level of a target signal. A second control signal is generated within the integrated circuit based on a result of the comparison. The second control signal is configured to cause the analog signal to have a second signal level. The second control signal has a second predetermined duration that is different than the first predetermined duration.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
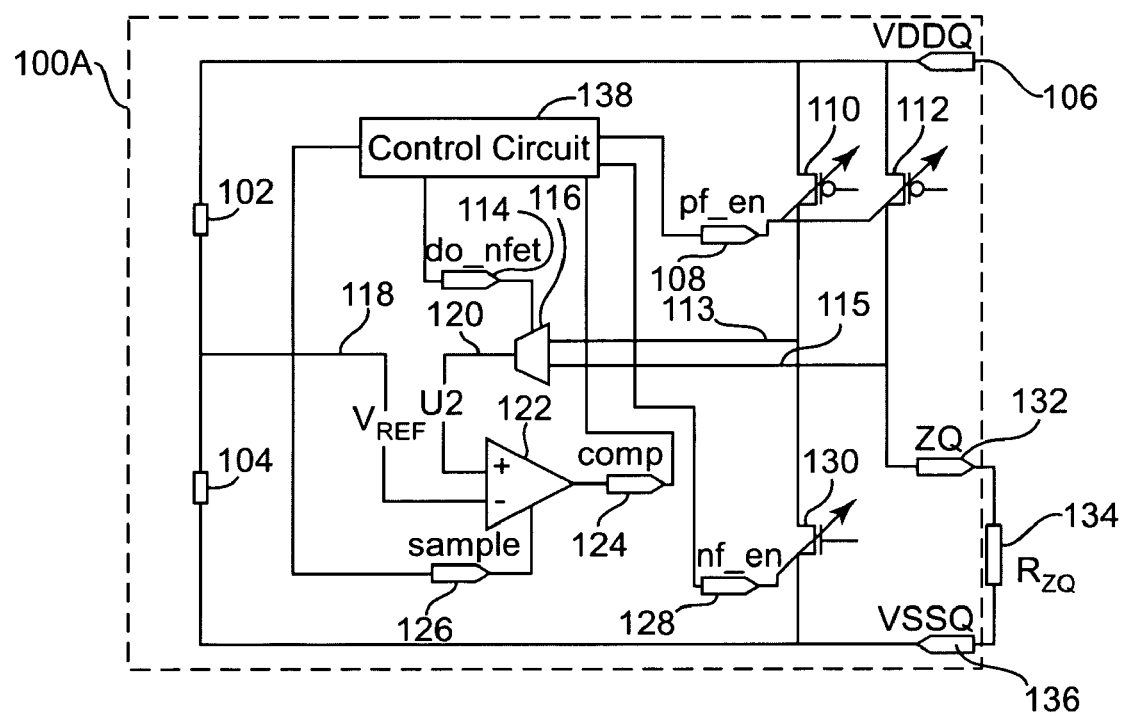
FIG. 1 is a diagram illustrating a calibration circuit according to one embodiment.

FIG. 1 is a diagram illustrating a calibration circuit 100A according to one embodiment. Calibration circuit 100A includes resistors 102 and 104, transistors 110, 112, and 130, analog multiplexer 116, analog comparator 122, and control circuit (controller) 138. In one embodiment, controller 138 is integrated with circuit 100A. In another embodiment, controller 138 is an external controller. In one embodiment, transistors 110 and 112 are p-channel field effect transistor (PFET) devices that are configured as pull-up transistors, and transistor 130 is an n-channel field effect transistor (NFET) device that is configured as a pull-down transistor. In one embodiment, transistors 110, 112, and 130 comprise an output driver circuit that produces analog drive signals. Circuit 100A includes a $V_{DDQ}$ voltage supply line 106 and a $V_{SSQ}$ voltage supply line 136 for providing supply voltages (or a supply voltage and ground, respectively) to the circuit 100A. Resistors 102 and 104 are coupled between supply lines 106 and 136. A $V_{ref}$ line 118 is connected to the node between the resistors 102 and 104, and is connected to the negative input of the comparator 122. Transistor 110 is coupled between voltage supply 106 and transistor 130. Transistor 130 is coupled between transistor 110 and voltage supply 136. Transistor 112 is coupled between voltage supply 106 and ZQ pin 132. An external resistor ($R_{ZQ}$) 134 is coupled between ZQ pin 132 and voltage supply 136. Multiplexer 116 includes a first input coupled via line 113 to a node between transistor 110 and transistor 130, and a second input coupled via line 115 to a node between transistor 112 and ZQ pin 132. Multiplexer 116 includes an output coupled via U2 line 120 to the positive input of comparator 122.

Calibration circuit 100A further includes pf_en input 108, do_nfet input 114, sample input 126, comp output 124, and nf_en input 128, which are all connected to controller 138. In one embodiment, controller 138 is configured to vary the drive strength of the transistors 110, 112, and 130 using the control inputs 108 and 128, so that the DC impedances of the PFET transistors 110 and 112 (represented by $R_P$) and the NFET transistor 130 (represented by $R_N$) match the resistance of the $R_{ZQ}$ external resistor 134. This is done in one embodiment by driving the external resistor 134 with the PFET transistors 110 and 112, selecting the second input of the multiplexer 116 (coupled to line 115) via do_nfet input 114, and comparing the level of the resulting analog voltage (U2) on line 120 against the level of an internal reference or target analog voltage ($V_{ref}$) on line 118. The comparison of U2 against $V_{ref}$ is done in one embodiment by analog comparator 122 (or via an operational amplifier in another embodiment), which is gated by a signal from the controller 138 on the sample input 126. The result of the comparison is fed back to the controller 138 via a result signal on the comp output 124. In one embodiment, the result signal has either a first state or a second state based on whether the signal level of U2 exceeds the signal level of $V_{ref}$.

In one embodiment, resistors 102 and 104 have equal resistance values and the internal reference voltage ($V_{ref}$) is equal to half of the supply voltage $V_{DDQ}$. The value for the voltage (U2) output by multiplexer 120 is given in the following Equation I:

$$U2 = V_{DDQ}(R_{ZQ}/(R_P + R_{ZQ}))$$ Equation I

Where:
U2=voltage at the output of the multiplexer 116;
$V_{DDQ}$=supply voltage;
$R_{ZQ}$=resistance of external resistor 134; and
$R_P$=impedance of PFET transistor.

In one embodiment, the PFET transistors 110 and 112 are controlled by controller 138 via pf_en input 108 to produce a voltage (U2) that matches or is equal to the reference voltage ($V_{ref}$), and equal DC impedances for the PFET transistors ($R_P$) and the external resistor 134 ($R_{ZQ}$), as shown in the following Equation II:

$$U2 = V_{ref} = V_{DDQ}/2 \rightarrow R_P = R_{ZQ}$$ Equation II

Where:
U2=voltage at the output of the multiplexer 116;
$V_{ref}$=reference voltage at the negative input of the comparator 122;
$V_{DDQ}$=supply voltage;
$R_P$=impedance of PFET transistor; and
$R_{ZQ}$=resistance of external resistor 134.

In one embodiment, the pf_en signal and nf_en signal are analog signals that control the gate voltage of transistors 110, 112, and 130. In another embodiment, transistors 110, 112, and 130 are each implemented with a plurality of differently sized transistors that are connected in parallel, and the pf_en and nf_en signals are multiple-bit digital signals or digital control words (with each bit enabling or disabling a corresponding one of the parallel connected transistors). In one embodiment, the pf_en and nf_en controls signals generated by controller 138 each have a predetermined duration, and these signals are varied (e.g., increased or decreased) by predetermined amounts or step sizes. Controller 138 varies the control signals based on the result signal output by comparator 122 on comp output 124.

In one embodiment, transistors 110 and 112 are each implemented with five PFET transistors connected in parallel (also referred to as PFET fingers), which are controlled via input 108 using a 5-bit pf_en control signal (pf_en[4:0]) from controller 138. In one form of this embodiment, the widths (W) of the PFET transistors each increases by a factor of two (e.g., 1, 2, 4, 8, and 16 μm). Each of the five PFET transistors is controlled (e.g., enabled or disabled) by a corresponding one of the bits in the five-bit control signal on pf_en input 108, with the most-significant bit (MSB) of the control signal corresponding to the largest transistor (e.g., 16 μm), and the least-significant bit (LSB) of the control signal corresponding to the smallest transistor (e.g., 1 μm).

In one embodiment, controller 138 is configured to use a binary search algorithm (also referred to as a bisection algorithm or a successive approximation algorithm) that varies the binary weighted bits of pf_en from MSB to LSB and evaluates the output of comparator 122 (i.e., the value on comp output 124). An advantage of this algorithm according to one embodiment is that its time complexity grows only with $\log_2$ (N), where N is the total number of steps (i.e., the resolution).

As an example, assume that a static impedance of 240 Ohms is desired for the PFET transistors, which corresponds to a transistor width of 10.7 μm. In one embodiment, controller 138 will first set the MSB of the pf_en signal (i.e., pf_en=10000, W=16), and comparator 122 will output a high signal (i.e., comp=1), indicating that U2 is too high. Controller 138 will then reset bit four (i.e., the MSB) and set bit three (i.e., pf_en=01000, W=8), and comparator 122 will output a low signal (i.e., comp=0), indicating that U2 is too low. Controller 138 will then keep the value for bit three and set bit two (i.e., pf_en=01100, W=12), and comparator 122 will output a high signal (i.e., comp=1), indicating that U2 is too high. Controller 138 will then reset bit two and set bit one (i.e., pf_en=01010, W=10), and comparator 122 will output a low signal (i.e., comp=0), indicating that U2 is too low. Controller 138 will then keep the value for bit one and set bit zero (i.e., pf_en=01011, W=11), and comparator 122 will output a high signal (i.e., comp=1), indicating that U2 is too high. In one embodiment, controller 138 will then keep the value for bit zero, and in another embodiment, bit zero is reset.

In one embodiment, PFET transistor 112 is calibrated as described above, and then the determined calibration parameters are copied to PFET transistor 110 (e.g., the final pf_en signal that is determined for transistor 112 is applied to transistor 110). After the PFET transistors 110 and 112 have been calibrated, the NFET transistor 130 is calibrated. The first input of the multiplexer 116 (coupled to line 113) is selected via do_nfet input 114. The NFET transistor 130 is varied by controller 138 via nf_en input 128, and the resulting voltage (U2') is compared against the internal reference voltage ($V_{ref}$) by comparator 122. The result of the comparison is fed back to the controller 138 via the comp output 124. The value for the voltage (U2') output by multiplexer 120 is given in the following Equation III:

$$U2' = V_{DDQ}(R_N/(R_P + R_N))$$ Equation III

Where:
U2'=voltage at the output of the multiplexer 116;
$V_{DDQ}$=supply voltage;
$R_N$=impedance of NFET transistor; and
$R_P$=impedance of PFET transistor.

In one embodiment, the NFET transistor 130 is controlled by controller 138 via nf_en input 128 to produce a voltage (U2') that is equal to the reference voltage ($V_{ref}$), and equal DC impedances for the PFET transistors ($R_P$), NFET transistor ($R_N$), and the external resistor 134 ($R_{ZQ}$), as shown in the following Equation IV:

$$U2' = V_{ref} = V_{DDQ}/2 \rightarrow R_N = R_P = R_{ZQ}$$ Equation IV

Where:
U2'=voltage at the output of the multiplexer 116;
$V_{ref}$=reference voltage at the negative input of the comparator 122;
$V_{DDQ}$=supply voltage;
$R_N$=impedance of NFET transistor;
$R_P$=impedance of PFET transistor; and
$R_{ZQ}$=resistance of external resistor 134.

Figure 2:
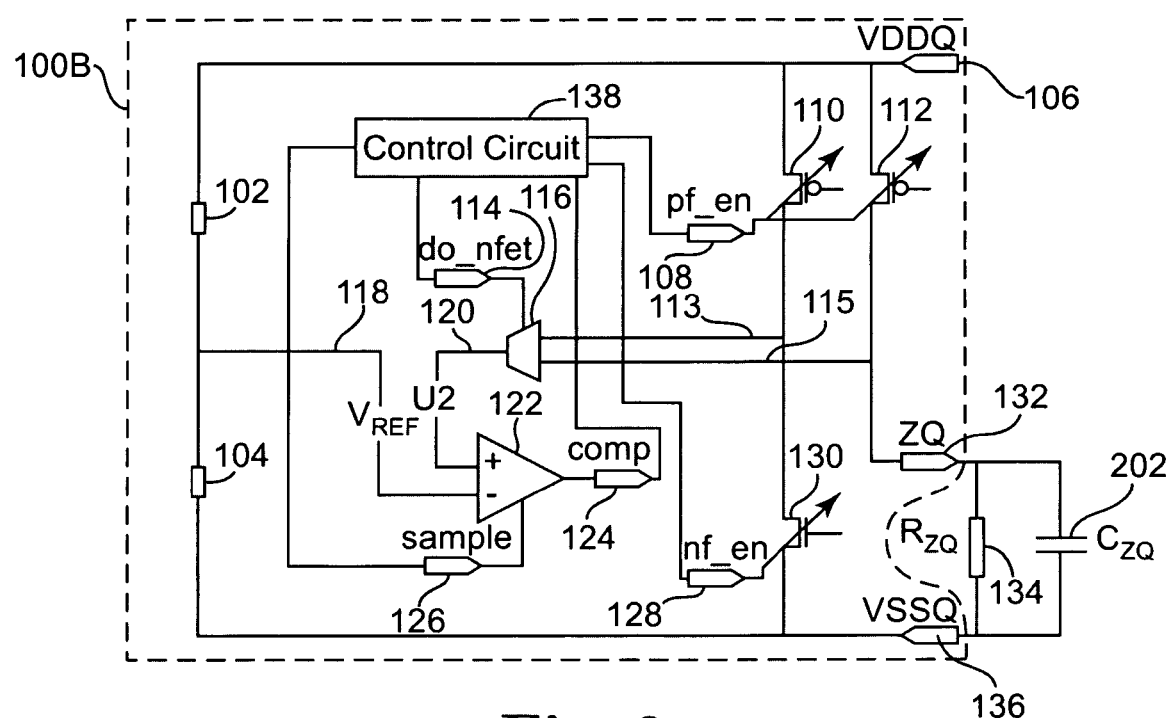
FIG. 2 is a diagram illustrating a calibration circuit with an additional capacitive load according to one embodiment.

FIG. 2 is a diagram illustrating a calibration circuit 100B with an additional capacitive load according to one embodiment. In an application that uses multiple calibration circuits (such as the circuit 100A shown in FIG. 1), the multiple circuits may share the external $R_{ZQ}$ resistor 134 provided that only one of the circuits is using the resistor 134 at any given time. For the single circuit using the resistor 134, the other circuits will appear as an additional capacitive load on the ZQ pin 132. This additional capacitive load is represented in FIG. 2 by $C_{ZQ}$ capacitor 202. The other elements of calibration circuit 100B are the same as the elements of calibration circuit 100A.

Figure 3:
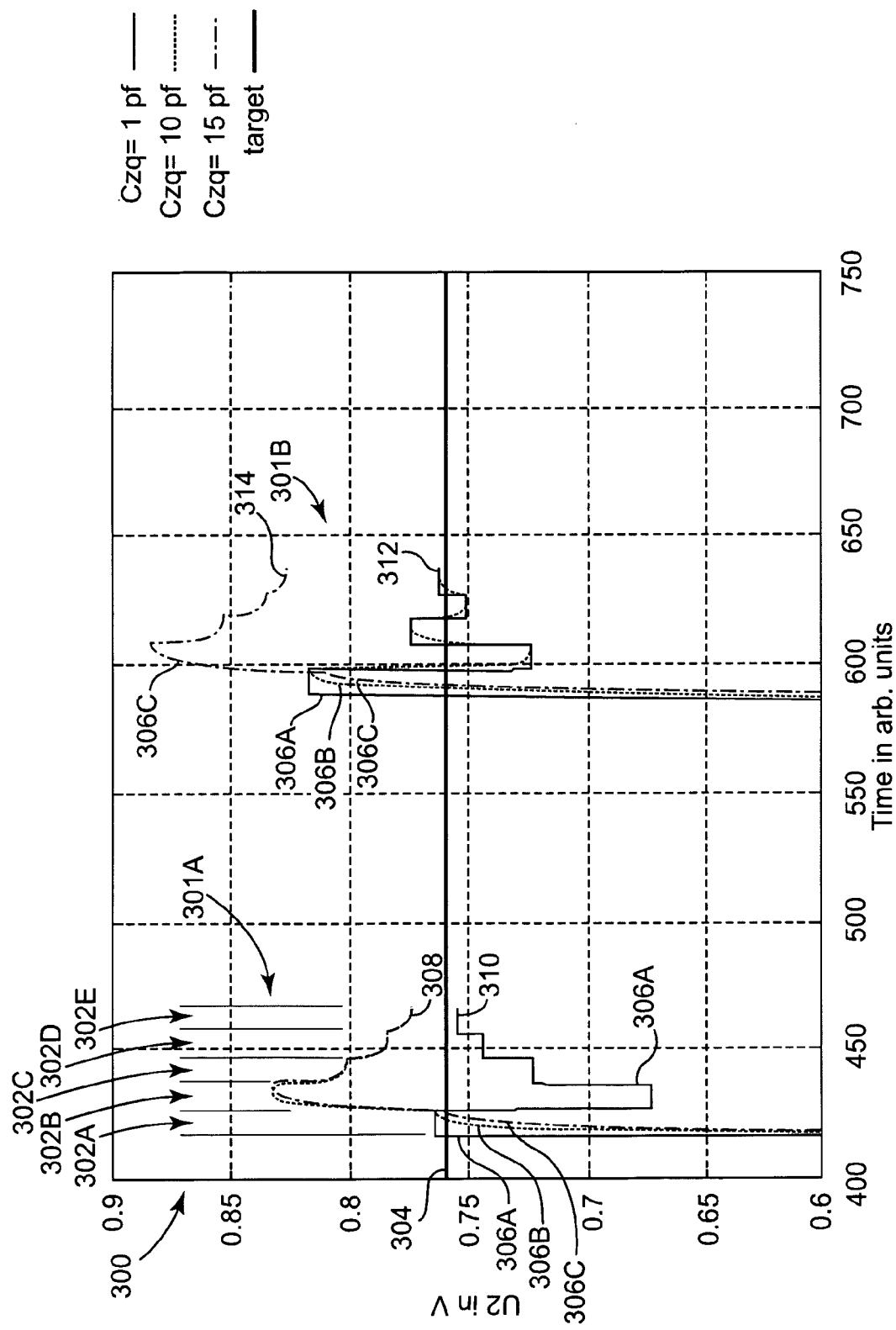
FIG. 3 is a diagram illustrating a graph of a comparison voltage versus time for different capacitance values of the capacitor in the circuit shown in FIG. 2 according to one embodiment.

The additional capacitive load represented by capacitor 202 has the effect that the comparison voltage (U2) will not instantaneously react on pf_en or nf_en changes, but there will be a damping effect so the reaction of U2 will be slowed down. FIG. 3 is a diagram illustrating a graph 300 of the comparison voltage (U2) versus time for different capacitance values of capacitor 202 in circuit 100B according to one embodiment. Line 304 represents a reference or target value for the comparison voltage (U2). Curve 306A represents the comparison voltage (U2) over time when a one pico farad (PF) capacitor is used for capacitor 202. Curve 306B represents the comparison voltage (U2) over time when a ten pF capacitor is used for capacitor 202. Curve 306C represents the comparison voltage (U2) over time when a fifteen pF capacitor is used for capacitor 202.

Two sets of curves 301A and 301B are shown in FIG. 3. The first set of curves 301A shows the comparison voltage (U2) over time when circuit 100B uses a first value for $R_{ZQ}$ resistor 134, and the second set of curves 301B shows the comparison voltage (U2) over time when circuit 100B uses a second value for $R_{ZQ}$ resistor 134. Similar sets of curves can be generated by using larger binary weights for the pf_en signal for the second set of curves 301B than the binary weights used for the first set of curves 301A.

For the first set of curves 301A, the time for decisions made by controller 138 is represented by reference numbers 302A-302E. The decision times 302A-302E correspond to the time between each signal provided to comparator 122 on sample input 126. The decision times 302A-302E also represent the duration of each of the control signals (e.g., pf_en or nf_en) generated by controller 138. In the embodiment shown in FIG. 3, the decision times 302A-302E are all equal in value, the sampling of comparator 122 by controller 138 is performed at regular intervals, and the control signals generated by controller 138 have equal durations. During each decision time 302A-302E, controller 138 samples the comp output 124 from comparator 122, and makes a decision regarding how to modify the control signal.

For the first set of curves 301A, for the first decision time 302A, controller 138 sets the MSB of the control signal (e.g., pf_en=10000). Curve 306A reacts relatively quickly to the pf_en signal and jumps up above the target value 304, and comparator 122 will output a high signal (i.e., comp=1) for this curve, indicating that U2 is too high. Controller 138 then reduces the pf_en signal during the second decision time 302B for curve 306A, and raises it during decision times 302C-302E. Thus, curve 306A settles to a value indicated at 310 that is close to the target value 304.

However, for curves 306B and 306C, when controller 138 sets the MSB of the pf_en signal, curves 306B and 306C react slower than curve 306A, and do immediately jump up above the target value 304. As a result, comparator 122 will incorrectly output a low signal (i.e., comp=0) for the curves 306B and 306C, indicating that U2 is too low. Controller 138 will then increase the pf_en signal during the second decision time 302B, causing a large overshoot for curves 306B and 306C, and controller 138 will then lower the control signal for decision times 302C-302E. Thus, curves 306B and 306C settle to a value indicated at 308 that is farther away from the target value 304 than the value 310 for curve 306A.

A disadvantage of one embodiment of the binary search algorithm discussed above is that every decision has a weight that is bigger than the sum of all subsequent decisions. This implies that one false decision cannot be compensated in subsequent steps. This is illustrated in the first set of curves 301A in FIG. 3, where the controller 138 makes an incorrect decision for curves 306B and 306C after setting the MSB, and the controller 138 is not able to compensate for this decision in subsequent steps. This is also illustrated in the second set of curves 301B in FIG. 3. In this example, curves 306A and 306B react quickly enough to allow controller 138 to make correct decisions at each step, so that these curves 306A and 306B settle to a value indicated at 312 that is close to the target value 304. However, curve 306C reacts slower, causing controller 138 to incorrectly increase the pf_en signal during the second decision time. Controller 138 is not able to compensate for this incorrect decision in subsequent steps, and curve 306C settles to a final value indicated at 314 that is much higher than the final value 312 for curves 306A and 306B.

One solution to the problem discussed above would be to reduce the frequency of all decisions made by controller 138 (i.e., increase the time for each decision), so that the comparison voltage (U2) has settled sufficiently before the decision for the next step is done. However, this will increase the duration of the whole calibration process. For certain applications this may not be tolerable (e.g., the off-chip driver (OCD) calibration of double data rate 3 dynamic random access memories (DDR3 DRAMS) is very limited in duration).

An incorrect decision is tolerable, if the final result of pf_en deviates from the value without the $C_{ZQ}$ capacitor 202 by one LSB only, as this is the natural discretization error. This is true when the comparison voltage (U2) has settled to its final value up to a voltage error equivalent to one LSB. Since the largest step size is $V_{DDQ}$, and assuming a resolution of N steps, the size of one LSB is equal to $V_{DDQ}/N$. The error in the comparison voltage (U2) diminishes exponentially over time as given in the following Equation V:

$$U2(t)=U2'+(U0-U2')e^{(-t/(R'C))} \quad \text{Equation V}$$

Where:
    U2(t)=value of the comparison voltage (U2) at time, t;
    U2'=target value of the comparison voltage (U2);
    U0=initial value of the comparison voltage (U2);
    R'=resistance value of the equivalent resistor composed by $R_{ZQ}$ and RP; and
    C=capacitance value of the $C_{ZQ}$ capacitor 202.

For t≧R'C ln(N), the comparison voltage (U2) must have settled to within one LSB. However, this is just a worst case calculation for the maximum step size (i.e., Δ=(U0-U2') =$V_{DDQ}$) to diminish. In the embodiment of the binary search algorithm described above, this will only be true for the turn on of the MSB. The step size for each subsequent bit will only be half of the previous step. From that, it can be concluded that for later steps, smaller settling times will be sufficient. In general, for a step size of Δ, a settling time as given in the following Equation VI is needed:

$$t \geq R'C \ln(N(\Delta/V_{DDQ})) \quad \text{Equation VI}$$

Where:
    t=time;
    R'=resistance value of the equivalent resistor composed by $R_{ZQ}$ and RP;
    C=capacitance value of the $C_{ZQ}$ capacitor 202;
    N=number of steps (resolution);
    Δ=step size; and
    $V_{DDQ}$=supply voltage.

So for a sequence of $\Delta_{i-1}=\Delta_i/2$, the settling time can be calculated as shown in the following Equation VII:

$$t_{i+1} \geq R'C \ln(N(\Delta_{i+1}/V_{DDQ})) = R'C(\ln(N(\Delta_i/V_{DDQ}))-\ln(2)) \quad \text{Equation VII}$$
$$= t_i - R'C \ln(2)$$

As shown by Equation VII, for every step size, the settling duration reduces by a constant amount. Thus, the duration of each evaluation or decision in the binary search algorithm performed by controller 13 8 according to one embodiment depends on the bit position, such that bits with a higher weight are given a longer settling time. In one embodiment, the duration of each decision reduces by a constant amount (e.g.

one or more clock periods) from the previous decision (e.g., four clock periods for the MSB, three clock periods for the next significant bit, two clock periods for the next significant bit, etc., or eight clock periods for the MSB, six clock periods for the next significant bit, four clock periods for the next significant bit, etc.). In one embodiment, when the duration for a given decision reaches a pre-determined minimum threshold value, the duration for all subsequent decisions remains at that pre-determined value (e.g., three clock periods for the MSB, two clock periods for the next significant bit, and one clock period for all remaining bits). It will be understood that the above are just a few examples of values that might be used to provide bit-position varying decision times, and that other embodiments may use other values.

Figure 4:
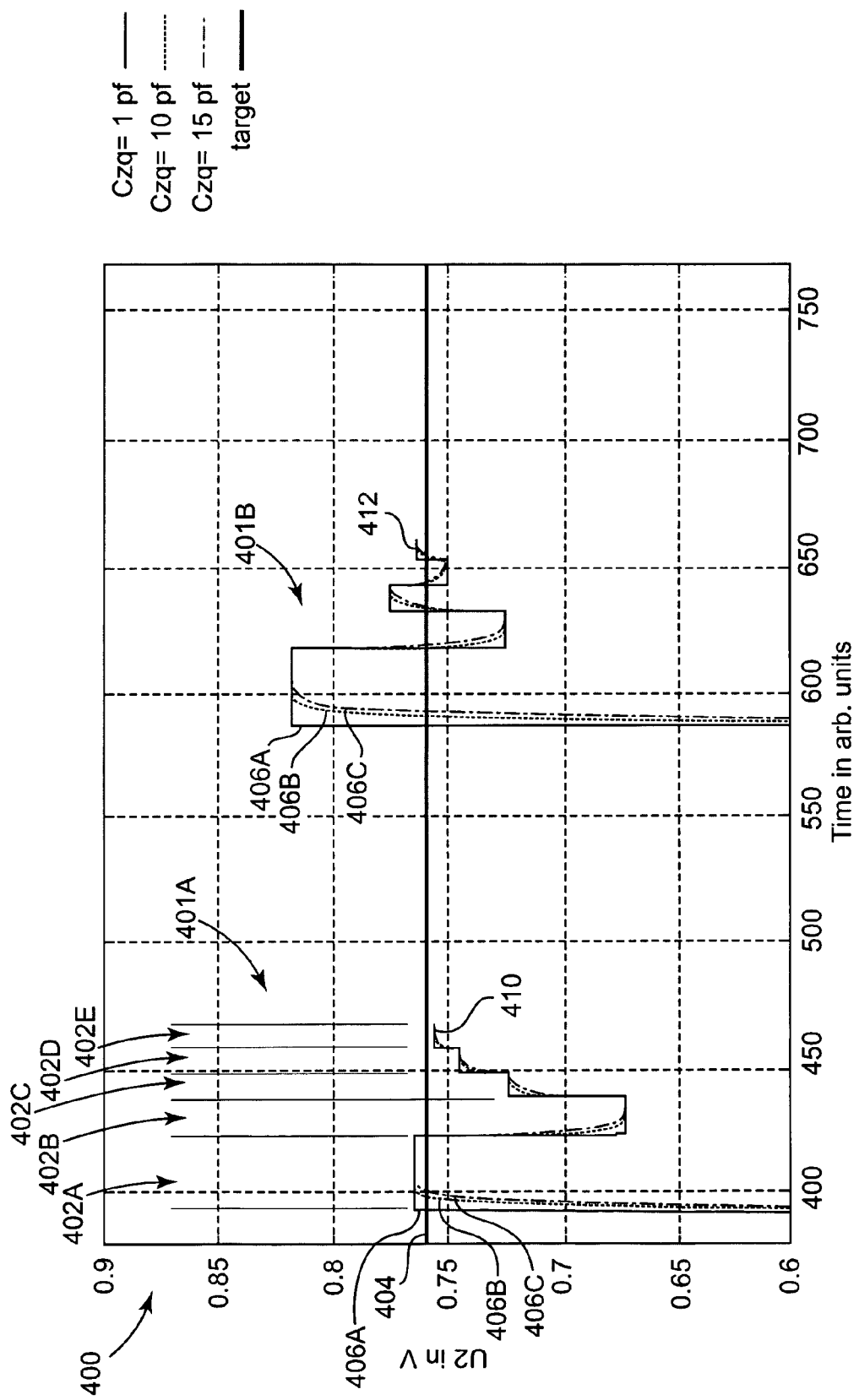
FIG. 4 is a diagram illustrating a graph of a comparison voltage versus time for different capacitance values of the capacitor in the circuit shown in FIG. 2 using bit-position varying decision times according to one embodiment.

FIG. 4 is a diagram illustrating a graph 400 of the comparison voltage (U2) versus time for different capacitance values of capacitor 202 in circuit 100B using bit-position varying decision times according to one embodiment. Line 404 represents a reference or target value for the comparison voltage (U2). Curve 406A represents the comparison voltage (U2) over time when a one pico farad (PF) capacitor is used for capacitor 202. Curve 406B represents the comparison voltage (U2) over time when a ten pF capacitor is used for capacitor 202. Curve 406C represents the comparison voltage (U2) over time when a fifteen pF capacitor is used for capacitor 202.

Two sets of curves 401A and 401B are shown in FIG. 4. The first set of curves 401A shows the comparison voltage (U2) over time when circuit 100B uses a first value for $R_{ZQ}$ resistor 134, and the second set of curves 401B shows the comparison voltage (U2) over time when circuit 100B uses a second value for $R_{ZQ}$ resistor 134. Similar sets of curves can be generated by using larger binary weights for the pf_en signal for the second set of curves 401B than the binary weights used for the first set of curves 401A.

For the first set of curves 401A, the time for decisions made by controller 138 is represented by reference numbers 402A-402E. The decision times 402A-402E correspond to the time between each signal provided to comparator 122 on sample input 126. The decision times 402A-402E also represent the duration of each of the control signals (e.g., pf_en or nf_en) generated by controller 138. In the embodiment shown in FIG. 4, the decision times 402A-402E vary based upon bit-position of the bit being varied in the control signal, the sampling of comparator 122 by controller 138 is performed at irregular intervals, and the control signals generated by controller 138 have predetermined durations that are different than each other, and that decrease over time until a threshold duration (e.g., one clock cycle) is reached. In the illustrated embodiment, the duration for the MSB (i.e., decision time 402A) is four times the duration of any one of the individual decision times 302A-302E shown in FIG. 3, and the duration for the next significant bit (i.e., decision time 402B) is two times the duration of any one of the individual decision times 302A-302E. The remaining decision times 402C-402E each have the same duration as the decision times 302A-302E. In other embodiments, different durations than those shown in FIG. 4 may be used for decision times 402A-402E.

For the first set of curves 401A, for the first decision time 402A, controller 138 sets the MSB of the control signal (e.g., pf_en=10000). Curve 406A reacts relatively quickly to the pf_en signal and jumps up above the target value 404, and comparator 122 will output a high signal (i.e., comp=1) for this curve, indicating that U2 is too high. Controller 138 then reduces the pf_en signal during the second decision time 402B for curve 406A, and raises it during decision times 402C-402E. Thus, curve 406A settles to a value indicated at 410 that is close to the target value 404.

Similarly, for curves 406B and 406C, when controller 138 sets the MSB of the pf_en signal, curves 406B and 406C react slower than curve 406A, but the increased decision time 402A allows the curves 406B and 406C to extend above the target value 404 like curve 406A prior to the next decision by controller 138. As a result, controller 138 makes correct decisions for curves 406B and 406C, and all three curves 406A-406C settle to the value indicated at 410 that is close to the target value 404.

The controller 138 also makes correct decisions for the set of curves 401B. In this example, curves 406B and 406C react slower than curve 406A, but the increased decision times at the MSB and MSB-1 positions allows the controller 138 to make correct decisions at each step, so that all three curves 406A-406C settle to a value indicated at 412 that is close to the target value 404. Thus, for the same capacitance values as those used in the example of FIG. 3 with constant decision times, the embodiment shown in FIG. 4 with varying decision times no longer suffers from incorrect decisions.

Figure 5:
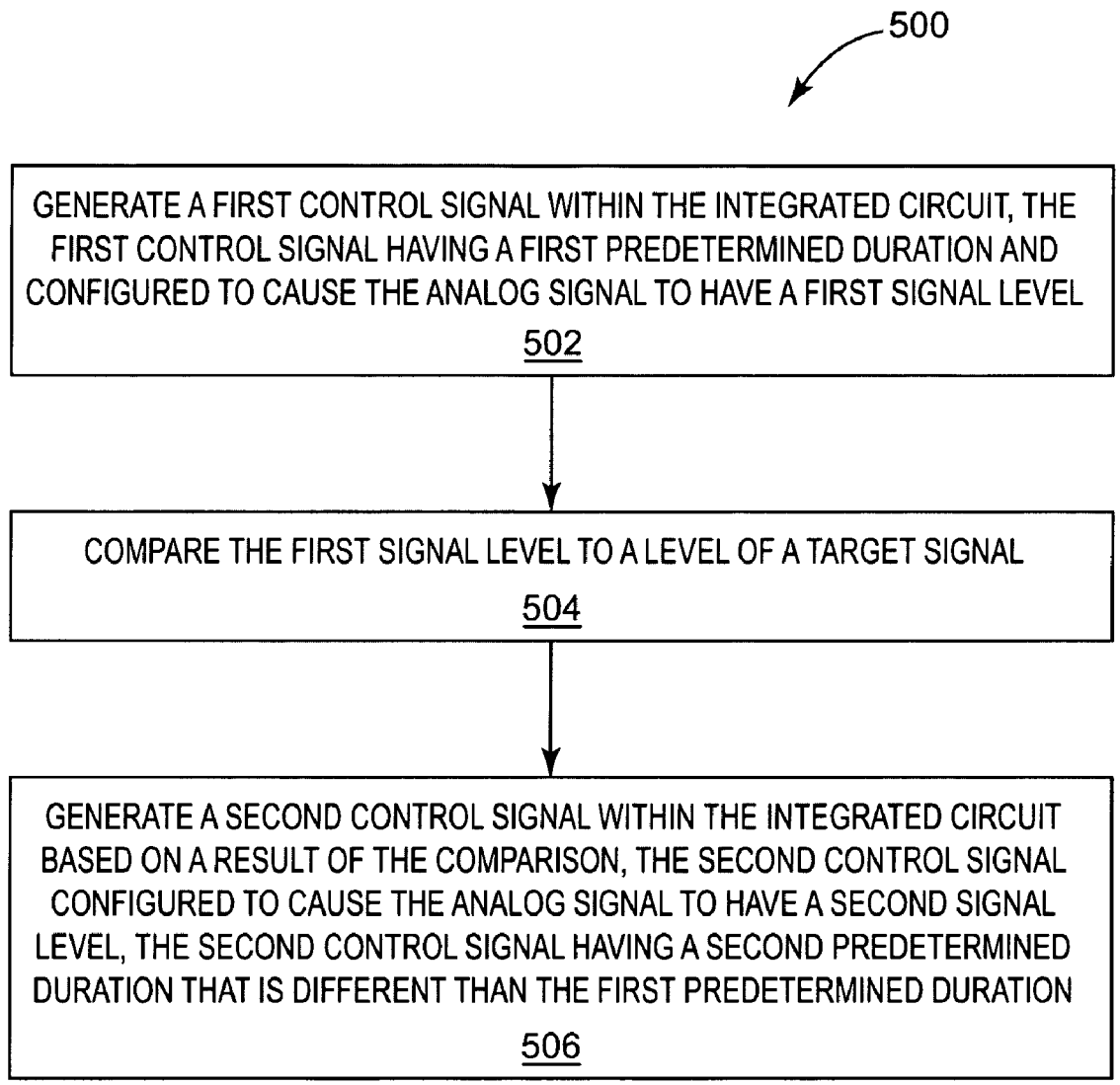
FIG. 5 is a flow diagram illustrating a method of controlling an analog signal in an integrated circuit according to one embodiment.

FIG. 5 is a flow diagram illustrating a method 500 of controlling an analog signal (e.g., analog signal U2) in an integrated circuit according to one embodiment. In one embodiment, circuits 100A and 100B are configured to perform method 500. At 502, controller 138 generates a first control signal (e.g., control signal pf_en) within the integrated circuit. The first control signal has a first predetermined duration and is configured to cause the analog signal to have a first signal level. At 504, comparator 122 compares the first signal level to a level of a target signal (e.g., $V_{ref}$). At 506, controller 138 generates a second control signal within the integrated circuit based on a result of the comparison. The second control signal is configured to cause the analog signal to have a second signal level. The second control signal has a second predetermined duration that is different than the first predetermined duration.

In one embodiment, circuits 100A and 100B are implemented on a DRAM integrated circuit, such as a DDR3 DRAM device, and are configured to perform OCD impedance calibration for the DRAM integrated circuit. In another embodiment, circuits 100A and 100B are implemented on an analog-to-digital converter (ADC) integrated circuit, and are configured to generate a digital representation of an analog value. For an analog-to-digital converter application, the reference voltage ($V_{ref}$) represents an analog voltage to be converted to a digital value, and the final value of the pf_en (or nf_en) provides the digital representation of this analog voltage. In other embodiments, the techniques described herein may be applied to other types of devices or circuitry that use a binary search algorithm, or more generally an algorithm with different weights for individual decisions.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of controlling an analog signal in an integrated circuit, the method comprising:

generating a first control signal within the integrated circuit, the first control signal having a first predetermined duration and configured to cause the analog signal to have a first signal level;

comparing the first signal level to a level of a target signal; and generating a second control signal within the integrated circuit based on a result of the comparison, the second control signal configured to cause the analog signal to have a second signal level, the second control signal having a second predetermined duration that is different than the first predetermined duration, wherein the first and second control signals are generated based on a binary search algorithm.

2. The method of claim 1, wherein the first predetermined duration is greater than the second predetermined duration.

3. The method of claim 2, wherein the first predetermined duration is at least twice as large as the second predetermined duration.

4. The method of claim 1, and further comprising:
generating additional control signals for controlling the analog signal, wherein the additional control signals have predetermined durations that decrease over time until a minimum threshold duration is reached.

5. The method of claim 1, wherein the first and second control signals are each multiple-bit signals.

6. The method of claim 5, wherein each bit of each multiple-bit signal corresponds to a transistor in the integrated circuit, and is configured to enable and disable the corresponding transistor.

7. The method of claim 1, wherein the binary search algorithm is configured to modify the analog signal to match the target signal.

8. The method of claim 1, wherein the second control signal is generated by increasing or decreasing the first control signal by a predetermined amount.

9. The method of claim 8, wherein the predetermined amount is one half of an amount of the first control signal.

10. The method of claim 1, and further comprising:
modifying the analog signal until an impedance within the integrated circuit matches an impedance of an external resistor.

11. An integrated circuit, comprising:
an output driver circuit configured to output a first analog signal based on a first control signal having a first predetermined duration; and a control circuit configured to compare the first analog signal to a reference analog signal, and generate a second control signal based on a result of the comparison to modify the first analog signal, the second control signal having a second predetermined duration that is different than the first predetermined duration, wherein the control circuit is configured to generate control signals based on a binary search algorithm.

12. The integrated circuit of claim 11, wherein the integrated circuit comprises a DDR3 DRAM.

13. The integrated circuit of claim 11, wherein the control circuit comprises a compare circuit configured to compare the first signal to the reference signal and generate a result signal having either a first state or a second state based on whether a signal level of the first signal exceeds a signal level of the reference signal.

14. The integrated circuit of claim 13, wherein the control circuit is configured to modify the first control signal by a predetermined amount, thereby generating the second control signal.

15. The integrated circuit of claim 14, wherein the control circuit is configured to increase the first control signal by the predetermined amount when the result signal has the first state and decrease the first control signal when the result signal has the second state.

16. The integrated circuit of claim 11, wherein the output driver circuit comprises a pull-up device and a pull-down device.

17. The integrated circuit of claim 16, wherein at least one of the pull-up device and the pull-down device comprises a plurality of differently sized transistors coupled in parallel, and wherein the first and second control signals are configured to enable and disable selected ones of the parallel connected transistors.

\* \* \* \* \*